United States Patent [19]

Sunda

[11] Patent Number: 6,013,897
[45] Date of Patent: Jan. 11, 2000

[54] ELECTRIC CIRCUIT BOARD HAVING PROTECTIVE PART AGAINST LIGHT BEAM SOLDERING

[75] Inventor: Fumihiro Sunda, Inazawa, Japan

[73] Assignee: Brother Kogyo Kabushiki Kaisha, Nagoya, Japan

[21] Appl. No.: 09/018,947

[22] Filed: Feb. 5, 1998

[30] Foreign Application Priority Data

Feb. 26, 1997 [JP] Japan ................................. 9-060032

[51] Int. Cl.[7] .............................. B23K 3/00; B41J 2/335; H05K 7/02; H05K 7/20; B73K 26/18
[52] U.S. Cl. ................. 219/216; 219/85.12; 219/121.63; 347/209; 361/760
[58] Field of Search .................................. 219/216, 85.1, 219/85.12–85.15, 121.63, 121.64, 121.65, 121.66; 347/208, 209; 361/760, 772, 774

[56] References Cited

U.S. PATENT DOCUMENTS

| | | | |
|---|---|---|---|
| 4,733,254 | 3/1988 | Yukihiro et al. ........................ | 347/209 |
| 5,021,630 | 6/1991 | Benko et al. ........................ | 219/121.64 |
| 5,175,410 | 12/1992 | Freedman et al. .................. | 219/121.63 |
| 5,220,353 | 6/1993 | Ota et al. ................................. | 347/209 |
| 5,274,210 | 12/1993 | Freedman et al. .................. | 219/121.63 |
| 5,280,301 | 1/1994 | Ota et al. ................................. | 347/209 |
| 5,298,715 | 3/1994 | Chalco et al. ...................... | 219/121.64 |

FOREIGN PATENT DOCUMENTS

| | | |
|---|---|---|
| 60-63175 | 4/1985 | Japan . |
| 6-198879 | 7/1994 | Japan . |

Primary Examiner—Joseph Pelham
Attorney, Agent, or Firm—Oliff & Berridge, PLC.

[57] ABSTRACT

An electric circuit board has a plurality of conductive pads on a base plate for connection with conductive pins of an electric device such as a thermal head of a facsimile machine. Protective parts are formed on the base plate at the right side of the rightmost conductive pad and at the left side of the leftmost conductive pad. The conductive pads and the conductive pins are soldered by solders heated and melted by a light beam. The protective parts protect the base plate from being burnt by the light beam even when the light beam is projected transversely across the pads from the right side of the rightmost pad to the left side of the leftmost pad.

16 Claims, 5 Drawing Sheets

6,013,897

ELECTRIC CIRCUIT BOARD HAVING PROTECTIVE PART AGAINST LIGHT BEAM SOLDERING

CROSS REFERENCE TO RELATED APPLICATION

This application relates to and incorporates herein by reference Japanese Patent Application No. 9-60032 filed on Feb. 26, 1997.

BACKGROUND OF THE INVENTION

1. Field of the Invention

The present invention relates to an electric circuit board having conductive parts for electrical connection with electric component devices through electric connecting members and, more particularly, to an electric circuit board on which the conductive parts and the electric connecting members are connected through solder melted by a light beam.

2. Description of Related Art

Various types of electric circuit boards are used for electric circuits which controls electric machines. For example, as shown in FIG. 6, an electric circuit board 80 is used for a driving circuit (not shown) which drives a thermal head 90 in a facsimile machine. The thermal head 90 is connected electrically to the electric circuit board 80 through a plurality of conductive pins 95 (95a, 95b). The pins 95 have respective top ends supported by bases 93 aligned in the longitudinal direction at the lower end side of the thermal head 90 and are molded by a resin material 94. A plurality of pads 82 (82a, 82b) are formed in a copper film pattern on a base plate 81 of the circuit board 80. The bottom ends of the pins 95 are soldered onto the corresponding pads 82. The bases 93 of the pins 95 are connected electrically to a printer head driver IC (integrated circuit, not shown) mounted on the thermal head 90, while the pads 82 are connected electrically to the driving circuit (not shown) mounted on the base plate 81.

The thermal head 90 has a plurality of heater elements 91 each of which are arranged to extend longitudinally. The head driver IC, receiving driving signals from the driving circuit through the pads 82, pins 95 and bases 93, supplies electric power to the heater elements 91, which in turn heat the ink to print information on a print paper (not shown). A heat sink or heat radiating plate 92 made of metal is provided to radiate the heat of the thermal head 90 therethrough.

Soldering the bottom ends of pins 95 onto the corresponding pads 82 is attained by a soldering apparatus (not shown). The soldering apparatus feeds string solders 61 (61a, 61b) from its arm 60 onto the bottom ends of the corresponding pins 95 and projects a laser beam 96 as a laser beam onto the top ends of the string solders 61 to heat and melt the solders 61.

The laser beam 96 is set to project onto the solders 61 to cover a predetermined fixed range from the rightmost solder 61a to the leftmost solder 61b. In the event that the laser beam projection starts from a point deviated leftward from the rightmost solder 61a, the solder 61a on the rightmost pin 95a will not be heated thus failing to solder the rightmost pin 95a with the corresponding rightmost pad 82a. In the event that the laser beam projection starts from a point deviated rightward from the rightmost solder 61a, on the contrary, the laser projection will end before it reaches the leftmost solder 61b. The solder 61b on the leftmost pin 95b will not be heated thus failing to solder the leftmost pin 95b with the corresponding leftmost pad 82b. As a result, the circuit board 80 and the thermal head 90 will not be connected electrically.

It is therefore required to direct the laser beam 96 toward the right position highly accurately. As the string solder 61 is very thin, however, it is difficult to direct the laser beam 96 toward the right solder 61 in position. directing the laser beam 96 accurately to the right position necessitates a longer period of time resulting in inefficient laser-soldering operation.

To solder all the pins 95 onto the corresponding pads 82 without fail, the range of projecting laser beam 96 is expanded in actual practice so that the laser beam projection moves in a direction Fl starting from a position 83 located at the right side of the rightmost pad 82a on the base plate 81 and ending at a position 84 located at the left side of the leftmost pad 82b on the base plate 81. Thus, the rightmost and leftmost pins 95a sand 95b are soldered assuredly onto the corresponding pads 82a and 82b respectively, even when the starting position of projecting the laser beam 96 is deviated from the originally designed position.

This arrangement, however, causes a drawback in that surrounding areas 85 and 86 adjacent to the rightmost and leftmost pads 82a and 82b are likely to change quality of plate material or be burnt by the heat of the laser beam 96. Those change in quality or burning at the sides of the base plate 81 tends to cause the surface of the base plate 81 to peel off from the burnt parts. As this peeling progresses as the facsimile machine vibrates in operation, rigidity of the base plate 81 lowers at the places where the peeling has occurred. Thus, electrical connection between the rightmost pin 95a and the pad 82a is likely to be damaged, thus disabling required operation of the thermal head 90 in the facsimile machine.

SUMMARY OF THE INVENTION

It is therefore an object of the present invention to provide an electric circuit board which is resistive to a laser beam soldering.

According to the present invention, an electric circuit board is provided with a protective part on its base plate. The protective part is around a conductive pad on the base plate and covers an area where a light beam projection for soldering is directed. The protective part protects the base plate from changing quality or being burnt by the light beam even when the light beam projection deviates from the right position to surrounding areas.

Preferably, the protective part is provided around both of the first and last ones of conductive pads to which corresponding conductive terminal pins are to be soldered first and last respectively by the light beam projection.

More preferably, the protective part has a part which is made of the same material as the conductive pad.

Still more preferably, the electric circuit board supports thereon a driving circuit which controls heating operation of heater elements on a thermal head used in an image printing apparatus such as a facsimile machine.

BRIEF DESCRIPTION OF THE DRAWINGS

Other objects, features and advantages of the present invention will be made more apparent by the following detailed description with reference to the accompanying drawings. In the accompanying drawings.

DETAILED DESCRIPTION OF THE PREFERRED EMBODIMENT

Figure 1:
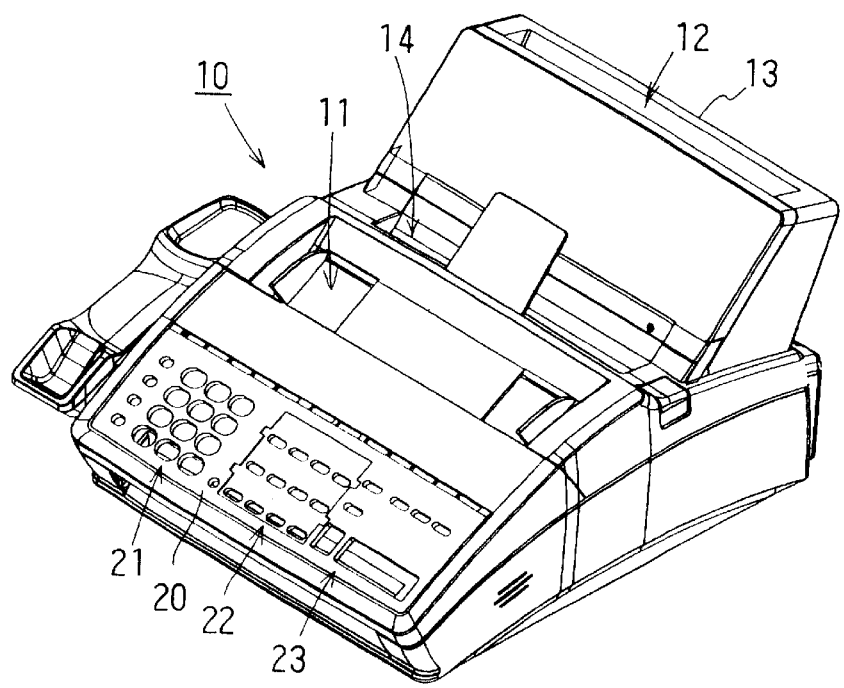
FIG. 1 is a perspective view of a facsimile machine using an electric circuit board according to an embodiment of the present invention.

An electric circuit board according to the preferred embodiment of the present invention is applied to a facsimile machine 10 shown in FIG. 1. The facsimile machine 10 has at a front upper side thereof a control panel 20 which has dialing buttons 21, coded or short-cut dialing buttons 22, function buttons 23 for starting and ending facsimile transmission, and the like. The facsimile machine 10 also has at a rear side thereof a guide 11 for feeding a manuscript to be transmitted, a paper tray 13 having a paper storage 12 for storing paper on which transmitted information is to be printed, and a paper outlet opening 14 through which printed paper is discharged.

Figure 2:
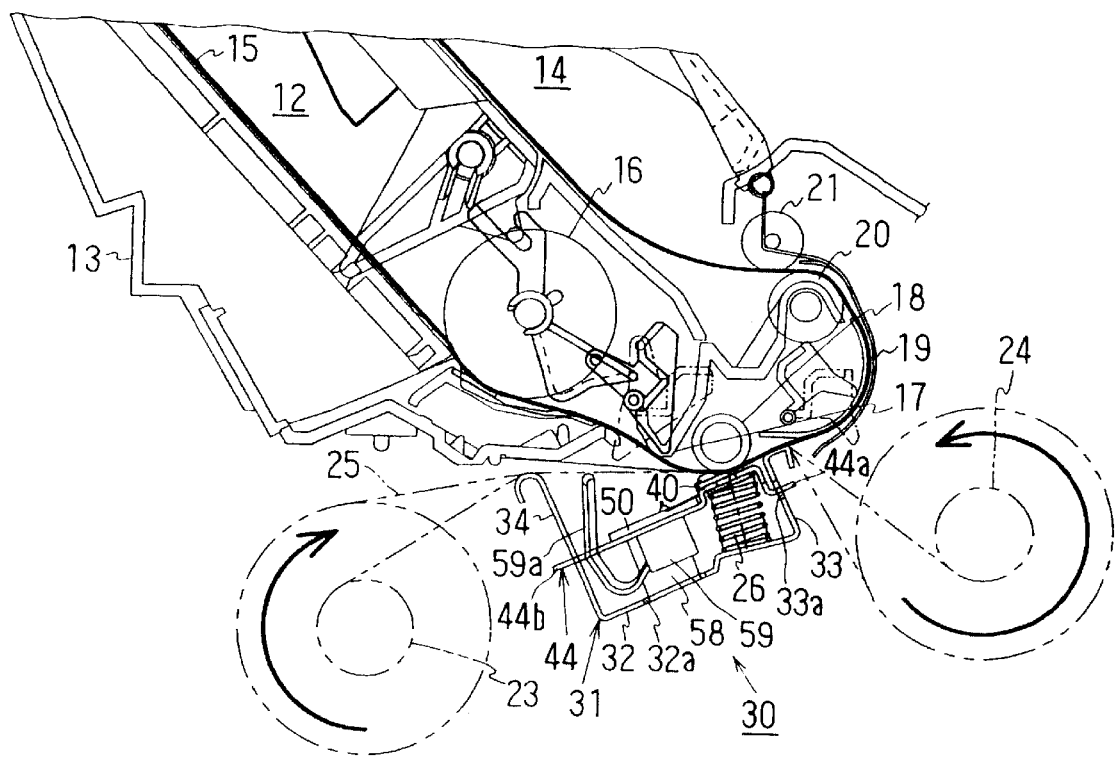
FIG. 2 is a partial side view of an internal mechanism of the facsimile machine shown in FIG. 1.

The facsimile machine 10 has a printer apparatus in its inside space as shown in FIG. 2. In the printer apparatus, a paper feeding roller 16 is provided in the bottom side of the paper storage 12 to feed paper 15 downward. A paper guide 17 is provided in the paper feeding direction of the roller 16 to guide the paper 15. A platen roller 18 is placed at the paper incoming side of the guide 17, and a printer 30 is provided at the downside of the platen roller 18 to print the information on the paper 15.

The printer 30 has a box-like housing 31 which comprises a bottom plate 32 and a pair of front and rear side plates 33 and 34 extending perpendicularly from the bottom plate 32. The front side plate 33 is provided with a front hook hole 33a with which a front hook 44a of a heat sink (heat radiating metal plate) 44 is hooked. The hook hole 33a is sized to allow the hook 44a to move up and down therein. The rear side plate 34 is also provided with a rear hook hole (not shown) with which a rear hook 44b of the heat sink 44 is hooked. Thus, the heat sink 44 is supported in the housing 31 so that its front side is pivotable around the rear hook 44b as a fulcrum.

Figure 3A:
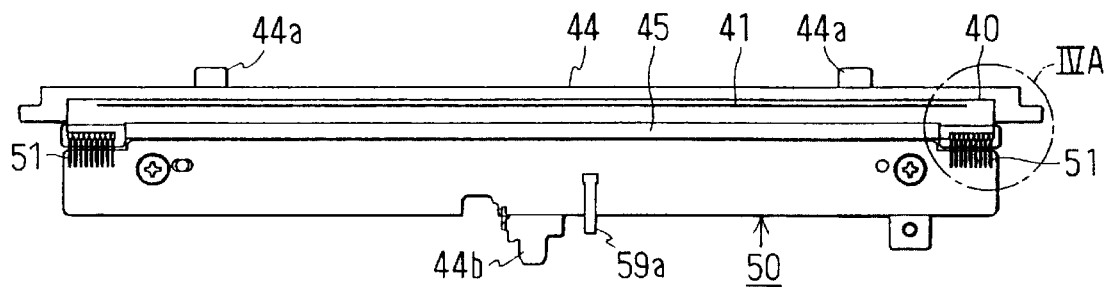
FIG. 3A is a front view of an arrangement of the electric circuit board on a thermal head.
Figure 3B:
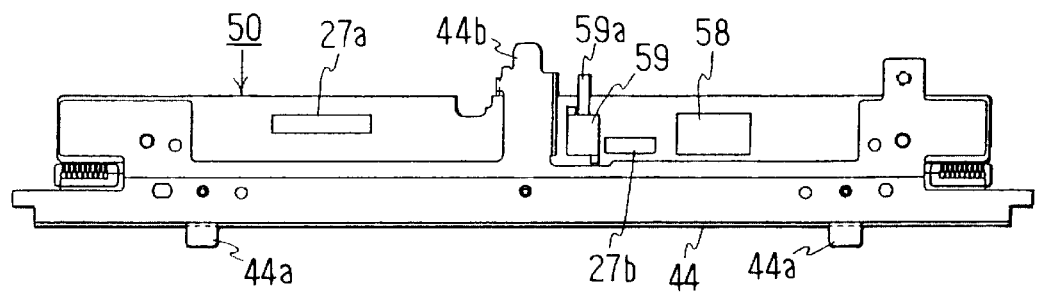
FIG. 3B is a bottom view of FIG. 3A

The printer 30 has a thermal head 40 which has a resin-mold part 45 as shown in FIG. 3A. A head driver IC (integrated circuit, not shown) is molded with the resin mold 45. An electric circuit board 50 which applies heater driving signals to the head driver IC is connected to the rear side of the thermal head 40. The circuit board 50 is mounted on the upper side of the heat sink 44. The circuit board 50 supports thereon, as shown in FIG. 3B, various electric component devices such as a power supply relay 58a, a ribbon sensor 59 which detects a presence/absence of an ink ribbon 25 and the like. The bottom of the power supply relay 58 is accommodated in a through hole 32a provided on the bottom of the bottom plate 32. The power supply relay 58 is held turned off before the printing on the paper 15 is started, but is turned on to supply the head driver IC with electric power for driving heater elements 41 when the printing on the paper 15 is to be performed. Thus, interruption of the power supply to the heater elements 41 on the thermal head 40 during non-printing interval prolongs the life of the thermal head 40.

Figure 3C:
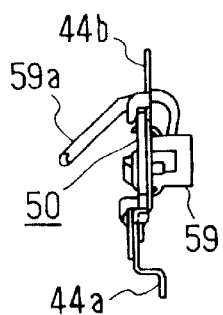
FIG. 3C is a left side view of FIG. 3A.

The ink ribbon 25 is interposed between the platen roller 18 and the thermal head 40. As the printing operation proceeds, the ink ribbon 25 is unwound from a feed roller 23 and wound around a winding roller 24. The ribbon sensor 59 has, as shown in FIGS. 3A to 3C, a detection switch 59a the top end of which is held pushed down by the ink ribbon 25 as long as the ink ribbon 25 is present. When the ink ribbon 25 becomes absent, however, the detection switch 59a moves up and detects absence of the ink ribbon 25.

A coiled spring 26 is disposed between the bottom plate 32 and the heat sink 44 at a position just underside the thermal head 40 so that the spring 26 normally biases the heat sink 44 upward. Thus, the thermal head 40 attached onto the upper side of the heat sink 44 is normally pressed to the lower side (printing side) of the platen roller 18 so that the thermal head 40 is held in a press-contact with the platen roller 18 through the ink ribbon 25.

A guide 19 is provided in front of the platen roller 18 to guide the paper 15 after printing. A pair of feed rollers 20 and 21 are disposed to feed into the paper outlet 14 the paper 15 passing through the guide 19.

As the thermal head 40 is driven in two channels according to this embodiment, a set of connector pins 51 are provided at each of longitudinal sides of the thermal head 40 and the circuit board 50 as shown in FIGS. 3A to 3C and 5. In FIG. 4, right side pins 51 for the right channel signal transmission and left side pins 51 for the left channel signal transmission are denoted as 51R and 51L, respectively.

The circuit board 50 has thereon an input/output terminal unit 27a connected to the input/output port of a CPU 28 mounted on a printed circuit board 28 and a power terminal unit 27b connected to a power supply source (not shown), as well as the power supply relay 58 and the ribbon sensor 59.

No. 1 and No. 2 terminals of the input/output terminal unit 27a receives detection signals TM1 and TM2 respectively from a pair of thermistors (not shown) which detect temperature of the heater elements 41. No. 3 terminal supplies 5-volt voltage to the pins 51L (No. 4) and the ribbon sensor 59 through a resistor R2, No. 4 terminal outputs a strobe signal ST2 to the pins 51L (No. 5), and No. 5 terminal receives an image data signal from the CPU 28 and outputs the same to the pins 51L (No. 7). No. 6 terminal outputs a strobe signal ST1 to the pins 51R (No. 6), No. 8 terminal receives a detection signal from the ribbon sensor 59, No. 9 terminal transmits a clock signal through a diode D1 and is grounded through a diode D2. The No. 9 terminal is connected to the 5-volt voltage terminal (+5 V) through the diode D1 and to the pins 51R (No. 3). No. 10 terminal receives from the pins 51R (No. 5) through a resistor R1 a data signal which is used for smoothing printed image. No. 11 terminal outputs a latch signal to the pins 51R (No. 4).

It is to be noted that the production cost of the printed circuit board 29 increases with its area because the printed circuit board 29 is a multi-layered type, and that the circuit board 50 still has an extra area to mount other electric component devices thereon other than the ribbon sensor 59. Therefore, in this embodiment, the power supply relay 58 is mounted not on the printed circuit board 29 but on the circuit board 50 which has a small number of electric devices thereon. As the size of the power supply relay 58 is larger than other electric component devices including the CPU 28 on the printed circuit board 29, removal of the power supply relay 58 will save more mounting space than the removal of the other electric devices. This arrangement reduces advantageously the manufacturing cost of the printed circuit board 29 and in the end the cost of the facsimile machine 10.

Figure 4A:
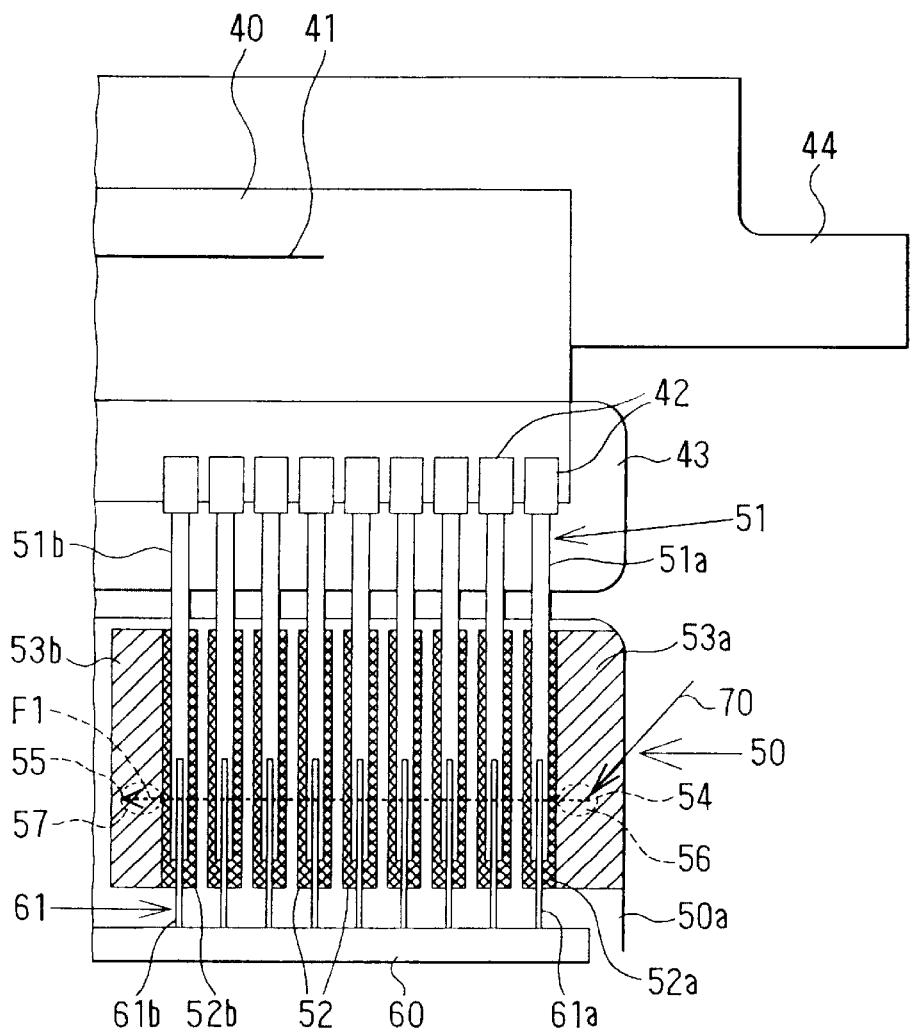
FIG. 4A is an enlarged plan view of a part of the electric circuit board and the thermal head shown in FIG. 3A.
Figure 4B:
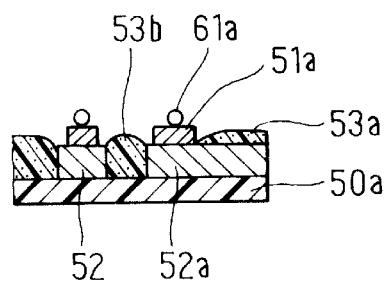
FIG. 4B is a partial cross sectional view of the circuit board shown in FIG. 4A.
Figure 5:
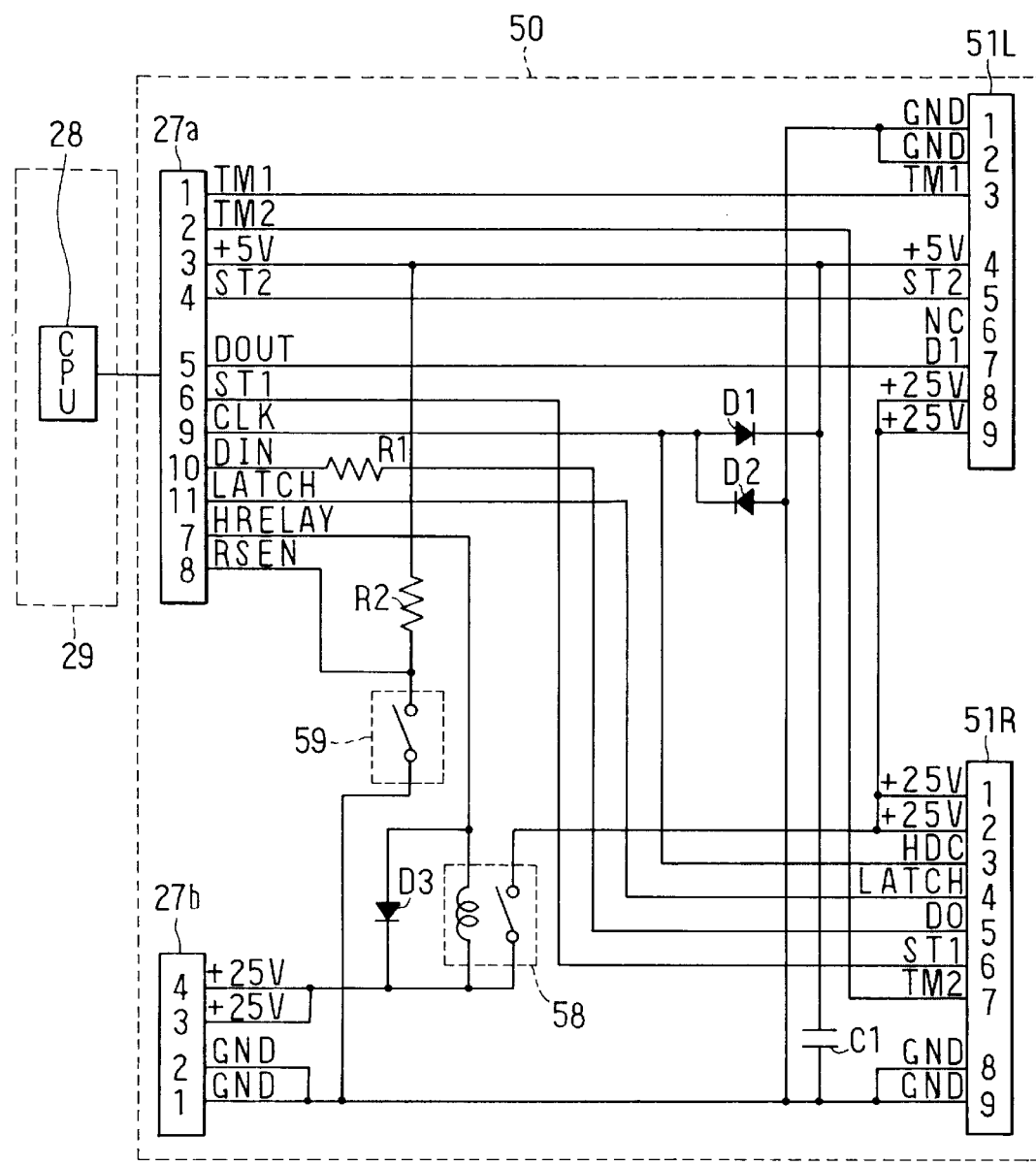
FIG. 5 is an electric wiring diagram of an electric circuit mounted on the circuit board shown in FIG. 2.
Figure 6:
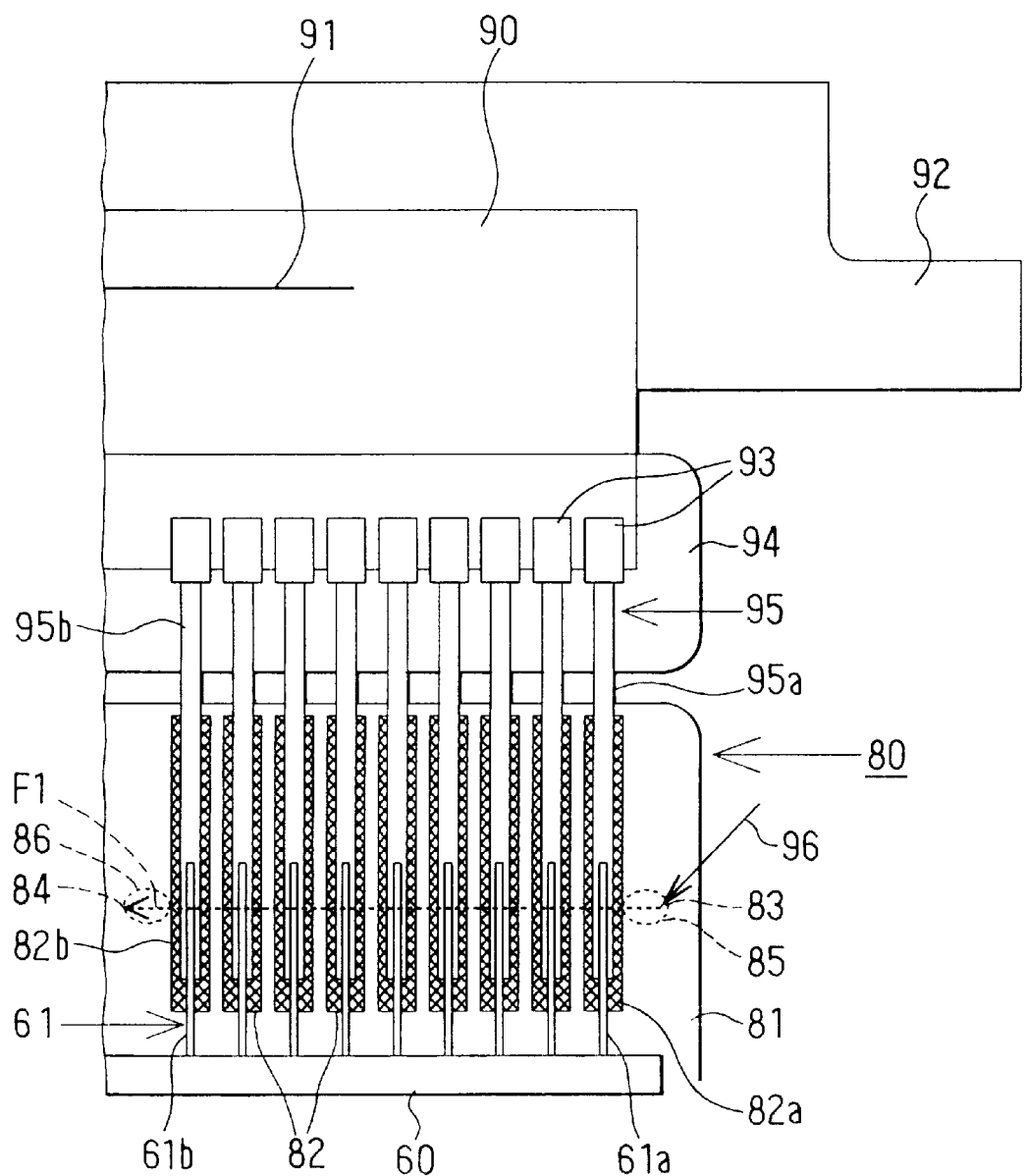
FIG. 6 is an enlarged view of a part of an electric circuit board and a thermal head according to a related art.

The circuit board 50 is connected to the thermal printer 40 through the connector pins 51 as shown in FIGS. 3A, 4A and 4B. The thermal head 40 is shaped longitudinally in a width direction of the paper 15 and each heater element 41 is arranged to extend longitudinally at a plurality (for example, 1728) of locations. The resin mold 45 is provided longitudinally underside the heater elements 41. The head driver IC is molded with the resin mold 45 at a plurality (for example, 12) of locations in the longitudinal direction. The heat sink 44 is attached to the front side (upper side in FIG. 3A) of the thermal head 40 to radiate heat generated by the heater elements 41, while the circuit board 50 is connected to the rear side (lower side in FIG. 3A) of the thermal head 40. The thermal head 40 is made of a ceramics material, while the heat sink 44 is made of an iron.

Though the thermal head 40 and the circuit board 50 are connected at the right longitudinal side as shown in FIG. 4A, they are connected at the left longitudinal side in the similar manner. As shown in FIG. 4A, a plurality (9) of bases 42 for supporting the top ends of the corresponding pins 51 (51a, 51b) are aligned in the longitudinal direction at the right lower corner and molded by a resin mold 43. The resin mold 43 thus seals the bases 42 air-tightly and absorbs by its elasticity a force which will exert on connection parts between the thermal head 40 and the circuit board 50. As the thermal head 40 is supported to be movable up and down by the coiled spring 26, the resin mold 43 absorbs the force produced by the up-down movement of the thermal head 40 and exerting on the connection parts.

As shown in FIGS. 4A and 4B, a plurality of conductive pads 52 which face the bases 42 are formed in a film pattern parallelly on the right upper corner of a base plate 50a. The bottom ends of the pins 51 (51a, 51b) which are also parallel to each other are soldered onto the corresponding pads 52 by string solders 61 (61a, 61b). A protective part 53a is provided in a film form on the base plate 50a at the right side of the rightmost pad 52a, while a protective part 53b is provided in a film form on the base plate 50a at the left side of the leftmost pad 52b.

Each pad 52 (52a, 52b) is made of a copper by etching and a solder resist 53c is formed between the adjacent pads 52 by a screen printing. Each of protective parts 53a and 53b is made by forming a solder resist over the copper pattern which is formed integrally and at the same time as forming the pads 52 by the etching. The solder resists for the protective parts 53a and 53b are formed at the same time as forming the solder resists 53c between the adjacent pads 52 by the screen printing. Thus, the protective parts 53a and 53b may be provided on the base plate 50a without any additional processes thereby enhancing efficiency in manufacturing the circuit board 50.

As shown in FIG. 3B, on the back side of the pins 51, the same number of pins (not shown in FIGS. 4A and 4B) are provided to face the pins 51. Thus, two sets of the pins sandwiches therebetween the upper side of the circuit board 50.

The base plate 50a is made of phenolic paper or plate. Each string solder 61 contains tin (60%) and flux (2.7% to 2.9%). The solder resist 53c provided as the protective parts 53a and 53b at the right and left sides of the rightmost and leftmost pads 52a and 52b and between the adjacent pads 52 is formed by screen-printing epoxy resin which is hardened by ultraviolet rays.

In this embodiment, the pins 51 and the pads 52 are soldered by the string solders 61 (61a, 61b) as follows by projecting a light beam 70 to heat and melt the string solders 61. The light beam may be provided by collimating light rays from a xenon lamp (not shown).

First, top ends of the string solders 61 are sent out from an arm 60 of a soldering apparatus (not shown) onto the corresponding pins 51. Then, the light beam 70 is moved in a direction Fl from a projection start point 54 defined on the protective part 53a to a projection end point 55 defined on the protective part 53b.

As each of the string solders 61 (61a, 61b) are very thin (for example, 0.5 mm), there may occur that the rightmost or leftmost pin 51a or 51b cannot be soldered assuredly with the corresponding rightmost or leftmost pad 52a or 52b by the light beam 70 if the beam 70 is set to cover only a predetermined fixed range from the rightmost solder 61a to the leftmost solder 61b. That is, in the event that the light beam projection starts from a point deviated leftward from the rightmost solder 61a, the solder 61a on the rightmost pin 51a will not be heated thus failing to solder the rightmost pin 51a with the corresponding rightmost pad 52a. In the event that the light beam projection starts from a point deviated rightward from the rightmost solder 61a, on the contrary, the laser projection will end before it reaches the leftmost solder 61b. The solder 61b on the leftmost pin 51b will not be heated thus failing to solder the leftmost pin 51b with the corresponding leftmost pad 52b.

In this embodiment, therefore, the range of projecting the light beam 70 is expanded so that the light beam projection starts from the position 54 located at the right side of the rightmost pad 52a on the base plate 50a and ends at the position 55 located at the left side of the leftmost pad 52b on the base plate 50a. Thus, the rightmost and leftmost pins 51a and 51b are soldered assuredly onto the corresponding pads 52a and 52b respectively, even when the starting position of projecting the light beam 70 is deviated to a certain extent from time to time.

As the protective parts 53a and 53b are provided respectively on projection areas 56 and 57 ranging from the projection start point 54 to the right side end of the rightmost pad 52a and ranging from the left side end of the leftmost pad 52b to the projection end point 55, the light beam 70 is restricted from projecting directly onto the base plate 50a. Thus, the protective parts 53a and 53b protects the base plate 50a from changing its quality or being burnt by the heat caused by the light beam 70 at the projection areas 56 and 57. The base plate 50a is restricted from peeling off from its surface around the areas 56 and 57. As a result, the pins 51 and the pads 52 are held in good electrical contact with each other and the rigidity of the base plate 50a is maintained.

As the thermal head 40 and the circuit board 50 are connected in the course of a sequence of assembling the facsimile machine 10, it is most desirable to shorten to a minimum the time required for accurately adjusting or positioning the projection point of the light beam 70. As described above, the circuit board 50 having the protective parts 53a and 53b obviates the accurate adjusting or positioning work, the facsimile machine 10 may be assembled efficiently.

It is to be noted that the above embodiment may be modified in various ways. For instance, the protective parts 53a and 53b may be provided without a solder resist, that is, by only a copper pad pattern which is integral with the rightmost pad 52*a* and covers base plate 50*a* from the right side of the rightmost pad 52*a* to the right side end of the base plate 50*a* and a copper pad pattern which is integral with the leftmost pad 52*b* and covers the left side of the leftmost pad 52*b*. Further, the conductive pattern underside the protective parts 53*a* and 53*b* may be formed by materials other than the copper. The light beam 70 for heating and melting the string solders 61 may be provided by a YAG laser, excimer laser or the like in place of a xenon lamp. Still further, the string solders 61 may be fed one by one along with the movement of projection of the light beam 70.

The present invention should not be limited to the disclosed embodiment and its modifications but may be changed or altered further without departing from the spirit of the invention.

I claim:

1. An electric circuit board for an electric apparatus, comprising:
   a base plate;
   an electric circuit mounted on the base plate;
   a conductive part provided on the base plate connected to the electric circuit;
   a connector part connecting electrically the conductive part to the electric apparatus;
   a solder heated and melted by a projection of light beam to solder the conductive part and the connector part; and
   protective parts, provided on the base plate at locations which are adjacent to the conductive parts and subjected to the projection of light beam, for protecting the base plate from the projection of light beam.

2. The electric circuit board of claim 1, wherein:
   the light beam is projected from one area which is adjacent to one side of the conductive part to another area which is adjacent to another side of the conductive part; and
   the protective parts are provided on the one area and the another area.

3. The electric circuit board of claim 1, wherein:
   the connector part includes a plurality of terminal pins.

4. The electric circuit board of claim 1, wherein:
   the electric apparatus includes a printer head which heats a heater element to print information on a medium in response to a drive signal;
   the electric circuit is provided to apply the drive signal to the printer head through the conductive part and the connector part; and
   the conductive part are provided on both side areas of the base plate.

5. The electric circuit board of claim 1, wherein:
   the protective parts include respective parts which are made of the same material as that of the conductive part at the locations which are subjected to the projection of light beam.

6. The electric circuit board of claim 1, wherein:
   the protective parts include solder resists provided respectively on the base plate at the locations which are subjected to the projection of light beam.

7. The electric circuit board of claim 6, wherein:
   the protective parts further include respective parts which are made of the same material as that of the conductive part and interposed underside the solder resists.

8. The electric circuit board of claim 1, wherein:
   the conductive part includes a plurality of conductive pads aligned in parallel with each other; and
   the connector part includes a plurality of terminal pins aligned in parallel with each other and laid on corresponding ones of the conductive pads.

9. The electric circuit board of claim 8, wherein:
   the protective parts are provided at a right side of a rightmost one of the conductive pads and at a left side of a leftmost one of the conductive pads, respectively.

10. The electric circuit board of claim 9, wherein:
    solder resists are provided on the base plate between adjacent two of the conductive pads as well as at the right side and the left side as the protective pads.

11. An electric circuit board for an electric apparatus comprising:
    a base plate for an electric circuit;
    a plurality of conductive pads provided on the base plate for connection with the electric circuit and the electric apparatus;
    a plurality of connector members soldered to the conductive pads respectively by a projection of light beam across the connector members; and
    a pair of protective parts, provided on the base plate at a pair of locations which are adjacent to sidemost two of the conductive pads and subjected to the projection of light beam, for protecting the base plate from the projection of light beam.

12. The electric circuit board of claim 11, wherein:
    the protective parts include respective conductive parts which are integral with the sidemost two of the conductive pads and made of the same material as that of the conductive pads.

13. The electric circuit board of claim 12, wherein:
    the protective parts further include solder resists provided respectively on the conductive parts.

14. The electric circuit board of claim 13, wherein:
    solder resists are provided on the base plate between adjacent two of the conductive pads.

15. The electric circuit board of claim 11, wherein:
    the protective parts include solder resists provided on the base plate at intermediate locations between adjacent two of the conductive pads and the locations adjacent to the sidemost two of the conductive pads.

16. The electric circuit board of claim 11, wherein:
    each of the protective parts extends along each of the conductive pads and has a width wider than that of each of the pads.

* * * * *